US011095258B2

(12) United States Patent
 Nakai

(10) Patent No.: US 11,095,258 B2
(45) Date of Patent: Aug. 17, 2021

(54) CLASS AB AMPLIFIER AND OPERATIONAL AMPLIFIER

(71) Applicant: Mitsubishi Electric Corporation, Tokyo (JP)

(72) Inventor: Takayuki Nakai, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 16/757,895

(22) PCT Filed: Nov. 13, 2017

(86) PCT No.: PCT/JP2017/040788
§ 371 (c)(1),
(2) Date: Apr. 21, 2020

(87) PCT Pub. No.: WO2019/092887
PCT Pub. Date: May 16, 2019

(65) Prior Publication Data
US 2020/0343868 A1 Oct. 29, 2020

(51) Int. Cl.
 *H03F 3/45* (2006.01)
 *H03F 3/345* (2006.01)
 (Continued)

(52) U.S. Cl.
 CPC ............ *H03F 3/345* (2013.01); *H03F 1/0261* (2013.01); *H03F 3/20* (2013.01); *H03F 2200/432* (2013.01)

(58) Field of Classification Search
 CPC .......... H03F 3/345; H03F 1/0261; H03F 3/20; H03F 2200/432; H03F 3/3033;
 (Continued)

(56) References Cited

U.S. PATENT DOCUMENTS 8,008,974 B2* 8/2011 Ha ................... H03F 1/0261
 330/285
8,189,403 B2* 5/2012 Sohn ................ H03F 3/45183
 365/189.07
(Continued)

FOREIGN PATENT DOCUMENTS

| JP | 2003069347 A | 3/2003 |
|----|--------------|--------|
| JP | 2004201160 A | 7/2004 |
| JP | 2013162483 A | 8/2013 |

OTHER PUBLICATIONS

International Search Report (PCT/ISA/210) dated Jan. 30, 2018, by the Japan Patent Office as the International Searching Authority for International Application No. PCT/JP2017/040788.
(Continued)

*Primary Examiner* — Khanh V Nguyen
(74) *Attorney, Agent, or Firm* — Buchanan Ingersoll & Rooney PC

(57) ABSTRACT

A second main electrode of a first transistor is connected to a first main electrode of a sixth transistor, a second main electrode of the sixth transistor is connected to a first main electrode of a fifth transistor at a first node, a second main electrode of the fifth transistor is connected to a second main electrode of a second transistor, a control electrode of the fifth transistor is connected to the second main electrode of the fifth transistor, a second main electrode of a third transistor is connected to a first main electrode of a fourth transistor at a second node, and a control electrode of the fourth transistor is connected to the control electrode of the fifth transistor. A gain control amplifier controls a voltage supplied to a control electrode of the sixth transistor such that the first node and the second node are equal in voltage.

16 Claims, 8 Drawing Sheets

(51) Int. Cl.
*H03F 1/02* (2006.01)
*H03F 3/20* (2006.01)

(58) Field of Classification Search
CPC ............. H03F 3/45475; H03F 3/45183; H03F 3/3022; H03F 3/45192; H03F 3/26; H03F 3/3088; H03F 1/22; H03F 3/3001
USPC .................. 330/253, 254, 255, 262, 264
See application file for complete search history.

(56) References Cited

U.S. PATENT DOCUMENTS

| | | | |
|---|---|---|---|
| 9,306,522 B2 * | 4/2016 | Kronmueller | H03F 3/45179 |
| 2003/0058047 A1 | 3/2003 | Sakurai | |
| 2011/0001562 A1 * | 1/2011 | Sohn | H03F 3/45183 |
| | | | 330/254 |
| 2012/0038418 A1 * | 2/2012 | Akyol | G05F 3/262 |
| | | | 330/127 |

OTHER PUBLICATIONS

Written Opinion (PCT/ISA/237) dated Jan. 30, 2018, by the Japan Patent Office as the International Searching Authority for International Application No. PCT/JP2017/040788.
Allen, P. E., et al., "CMOS Analog Circuit Design 3rd Edition", Oxford, Jul. 2012, p. 366-369.

\* cited by examiner

BIASED STATE

BIASED STATE

BIASED STATE

CLASS AB AMPLIFIER AND OPERATIONAL AMPLIFIER

TECHNICAL FIELD

The present disclosure relates to a class AB amplifier and an operational amplifier employing the same.

BACKGROUND ART

A technique is known in which an idling current in a class AB amplifier of source follower type is controlled to suppress variation in frequency characteristics caused by variation in load-driving current (see NPL 1, for example).

Conventionally, an operational amplifier is known that includes at an output stage a class AB amplifier of source follower type capable of suppressing output impedance, in order to drive a resistive load (see NPL 1, for example).

This operational amplifier is an operational amplifier employing a class AB amplifier of source follower type at an output stage. The output stage consists of a source-grounded replica amplifier biased with a constant current by a current source, and a main amplifier formed by a combination of a source follower driven by the replica amplifier and a source-grounded amplifier.

CITATION LIST

Non Patent Literature

NPL 1: "CMOS ANALOG CIRCUIT DESIGN 3rd Edition," p. 366-369, P. E. ALLEN, et al., OXFORD

SUMMARY OF INVENTION

Technical Problem

In the operational amplifier of NPL 1, however, a transistor connected to an output terminal is switched ON and OFF depending on a value of the load-driving current, causing significant variation in voltage gain and output impedance. This results in significant variation in transfer function of the entire operational amplifier. Thus, the stability of a negative feedback circuit configured with the operational amplifier is compromised.

Accordingly, an object of the present disclosure is to provide a class AB amplifier in which voltage gain and output impedance do not vary depending on the value of a load-driving current, and an operational amplifier employing the class AB amplifier.

Solution to Problem

A class AB amplifier according to the present disclosure includes an input terminal, an output terminal, a first reference potential terminal, a second reference potential terminal, first to sixth transistors, and a gain control amplifier having an inverted input terminal, a non-inverted input terminal and a voltage output terminal. The first and third to sixth transistors are each a first conductivity type transistor, and the second transistor is a second conductivity type transistor. A second main electrode of the first transistor and a first main electrode of the sixth transistor are connected to each other, a second main electrode of the sixth transistor and a first main electrode of the fifth transistor are connected to each other at a first node, a second main electrode of the fifth transistor and a second main electrode of the second transistor are connected to each other, and a control electrode of the fifth transistor and the second main electrode of the fifth transistor are connected to each other. A second main electrode of the third transistor and a first main electrode of the fourth transistor are connected to each other at a second node, the second node being connected to the output terminal. A control electrode of the fourth transistor and the control electrode of the fifth transistor are connected to each other. The first reference potential terminal is connected to a first main electrode of the second transistor and a second main electrode of the fourth transistor. The second reference potential terminal is connected to a first main electrode of the first transistor and a first main electrode of the third transistor. The input terminal is connected to a control electrode of the first transistor and a control electrode of the third transistor. The non-inverted input terminal of the gain control amplifier is connected to the first node, the inverted input terminal of the gain control amplifier is connected to the second node, and the voltage output terminal of the gain control amplifier is connected to a control electrode of the sixth transistor. The gain control amplifier controls a voltage supplied to the control electrode of the sixth transistor such that the first node and the second node are equal in voltage.

Advantageous Effects of Invention

According to the present disclosure, when the first node and the second node differ in voltage, the gain control amplifier controls the voltage supplied to the control electrode of the sixth transistor such that the first node and the second node are equal in voltage. The fourth transistor can thereby be maintained in the ON state at all times, so that variation in voltage gain and output impedance depending on the value of a load-driving current can be prevented.

DESCRIPTION OF EMBODIMENTS

In the following, embodiments are described with reference to the drawings.

In the following description, a transistor is described as being configured as a MOS transistor. When a transistor is configured as a MOS transistor, a control electrode, a first main electrode and a second main electrode of the transistor serve as the gate, the source and the drain. All transistors have a threshold voltage Vth for brevity of description. Unless otherwise described, all transistors are operating in a strong inversion and saturation region. A voltage Vout at an output terminal VO of an operational amplifier has a constant value. In a biased state described later, output voltages Vout, Vout1 and Vout2 each have a voltage value, for example, a voltage value of half the power supply voltage, that allows all transistors to operate in the strong inversion and saturation region. Under this condition, when two transistors are equal in gate size, that is, a ratio of W/L, and in gate-source voltage, and both are operating in a saturation region, then currents flowing in the two transistors are identical. It is noted that W represents a gate width of the transistor, and L represents a gate length of the transistor.

Reference Example

Figure 1:
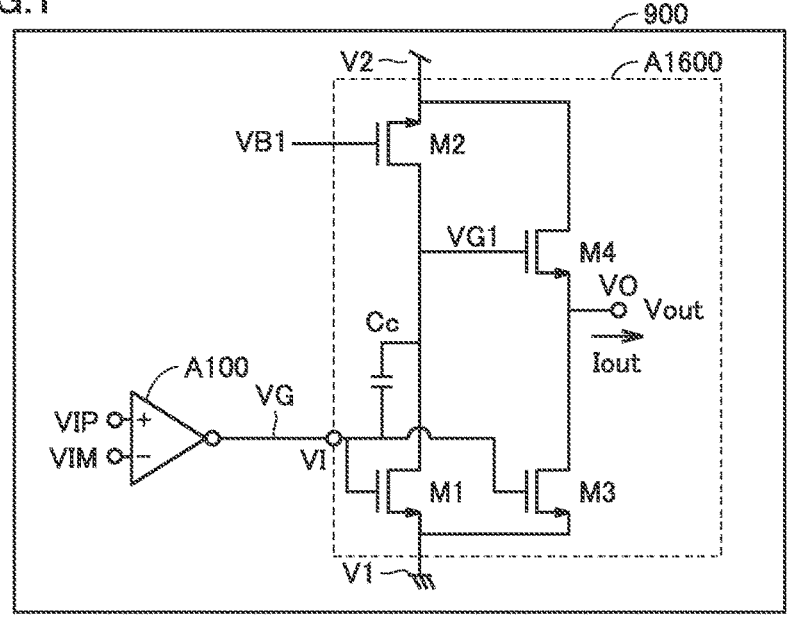
FIG. 1 represents a configuration of an operational amplifier 900 including a class AB amplifier in a reference example.

FIG. 1 represents a configuration of an operational amplifier 900 including a class AB amplifier in a reference example.

This operational amplifier 900 is a circuit for driving a resistive load.

This operational amplifier 900 includes a differential input stage A100 and an output stage A1600.

Output stage A1600 is a class AB amplifier of source follower type capable of suppressing output impedance. Output stage A1600 consists of a source-grounded replica amplifier biased with a constant current by a current source, and a main amplifier formed by a combination of a source follower driven by the replica amplifier and a source-grounded amplifier.

Output stage A1600 includes a first transistor M1, a second transistor M2, a third transistor M3, a fourth transistor M4, a capacitive element Cc, an input terminal VI, and an output terminal VO. First transistor M1 and second transistor M2 form a replica amplifier. Third transistor M3 and fourth transistor M4 form a main amplifier.

Input terminal VI receives a control voltage VG which is output from differential input stage A100.

First transistor M1 receives control voltage VG at its gate, and amplifies control voltage VG.

Second transistor M2 supplies a bias to first transistor M1.

Third transistor M3 functions as a source-grounded amplifier. Third transistor M3 has a gate for receiving control voltage VG, and drives output terminal VO.

Fourth transistor M4 functions as a source follower. Fourth transistor M4 has a gate for receiving an output voltage VG1 from the replica amplifier, and drives output terminal VO.

Capacitive element Cc is connected between a gate terminal and a drain terminal of first transistor M1. Capacitive element Cc is provided for phase compensation.

Figure 2:
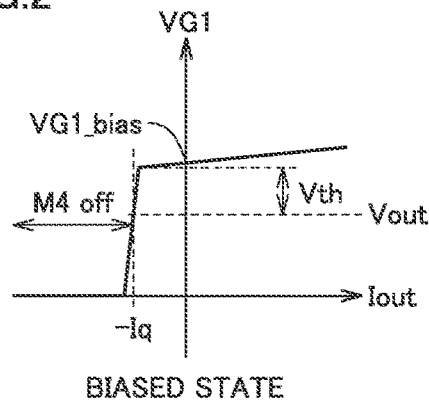
FIG. 2 represents relation between a load-driving current Iout which is output from operational amplifier 900 and an output voltage VG1 from a replica amplifier in the reference example.

FIG. 2 represents relation between a load-driving current Iout which is output from operational amplifier 900 and output voltage VG1 from the replica amplifier in the reference example.

Figure 3:
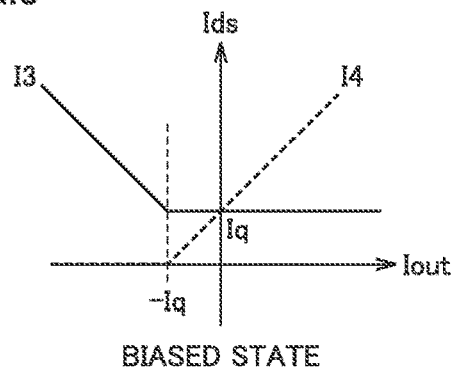
FIG. 3 represents relation between load-driving current Iout which is output from operational amplifier 900 and a current Ids in the reference example.

FIG. 3 represents relation between load-driving current Iout which is output from operational amplifier 900 and a current Ids in the reference example. Current Ids is a current I3 flowing in third transistor M3 and a current I4 flowing in fourth transistor M4.

Referring now to FIGS. 2 and 3, operation of output stage A1600 is described.

<Biased State>

First, a biased state in which operational amplifier 900 is not driving the load is described. The biased state corresponds to a state in which load-driving current Iout in FIGS. 2 and 3 is "0". In the biased state, current I3 flowing in third transistor M3 and current I4 flowing in fourth transistor M4 are equal to each other, causing load-driving current Iout which is output to the outside from output terminal VO to be zero. First transistor M1 has a gate length L1 and a gate width W1. Third transistor M3 has a gate length L3 and a gate width W3. The following relation holds:

$$N \times (W1/L1) = (W3/L3) \qquad (1)$$

where N is an integer.

First transistor M1 and third transistor M3 form a current mirror circuit. Thus, current I3 flowing in third transistor M3 and current I4 flowing in fourth transistor M4 are represented as follows using a current I1 flowing in first transistor M1:

$$Iq = I4 = I3 = N \times I1 \qquad (2)$$

In this equation, Iq assumes a positive value, and represents a quiescent current flowing in third transistor M3 and fourth transistor M4 in the biased state.

In the biased state, third transistor M3 and fourth transistor M4 are both biased to the ON state. Voltage Vout at output terminal VO is determined mainly by fourth transistor M4 having a source follower configuration with low output impedance. Specifically, control voltage VG which is output from differential input stage A100 is transferred from the gate to the drain of first transistor M1. The transferred voltage is further transferred from the gate to the source of fourth transistor M4, whereby output voltage Vout is determined.

Therefore, gate potential VG1 of fourth transistor M4 is maintained at a potential <VG1q> shifted by a voltage that exceeds threshold voltage Vth with respect to voltage Vout which is output to output terminal VO.

<Load-Driven State>

Next, a load-driven state in which the operational amplifier is driving the load is described.

In the load-driven state, load-driving current Iout is supplied from output terminal VO to the load. Load-driving current Iout is supplied from either third transistor M3 or fourth transistor M4 depending on its direction. The direction in which load-driving current Iout flows from output terminal VO to the load is a positive direction. Current I3 flowing in third transistor M3 and current I4 flowing in fourth transistor M4 are represented by the following equations:

$$I3 = Iq (Iout \geq -Iq) \qquad (3\text{-}1)$$

$$I3 = |Iout| (Iout < -Iq) \qquad (3\text{-}2)$$

$$I4=Iq+Iout(Iout\geq 0) \quad (3\text{-}3)$$

$$I4=Iq-|Iout|(-Iq\leq Iout<0) \quad (3\text{-}4)$$

$$I4=0(Iout-Iq) \quad (3\text{-}5)$$

As shown in the equations (3-1) to (3-5), current I3 flowing in third transistor M3 assumes a non-zero value at all times. That is, third transistor M3 is ON at all times. Current I4 flowing in fourth transistor M4 is zero under the condition of the equation (3-5). That is, fourth transistor M4 may be turned off.

A state in which fourth transistor M4 is ON, that is, current I4 is non-zero, is referred to as a state A. A state in which fourth transistor M4 is OFF, that is, current I4 is zero, is referred to as a state B.

In state A, voltage Vout at output terminal VO is determined, as in the biased state, mainly by fourth transistor M4 having a source follower configuration with low output impedance. Specifically, control voltage VG which is output from differential input stage A100 is transferred from the gate to the drain of first transistor M1. The transferred voltage is further transferred from the gate to the source of fourth transistor M4, whereby voltage Vout is determined.

A voltage gain AV (A) from input terminal VI to output terminal VO of output stage A1600 in state A is represented by the following equation:

$$AV(A)\approx gM1\times(rds1//rds2) \quad (4)$$

It is noted that gM1 represents a mutual conductance of first transistor M1. Rds1 represents a drain impedance of first transistor M1. Rds2 represents a drain impedance of second transistor M2. The sign // represents a combined impedance of two impedances connected in parallel.

An impedance Zout of output terminal VO in state A is represented by the following equation:

$$Zout(A)\approx 1/gM4 \quad (5)$$

It is noted that gM4 represents a mutual conductance of fourth transistor M4. It is assumed that the source follower formed by fourth transistor M4 has a voltage gain of 1 for brevity of description.

In state B in which fourth transistor M4 is OFF, that is, current I4 is zero, on the other hand, the path from the gate to the drain of first transistor M1, and further from the gate to the source of fourth transistor M4 is interrupted. Thus, a current is supplied from third transistor M3 to output terminal VO, whereby voltage Vout is determined.

A voltage gain AV (B) from input terminal VI to output terminal VO of output stage A1600 in state B is represented by the following equation:

$$AV(B)\approx gM3\times rds3 \quad (6)$$

It is noted that gM3 represents a mutual conductance of third transistor M3. Rds3 represents a drain impedance of third transistor M3.

Impedance Zout of output terminal VO in state B is represented by the following equation:

$$Zout(B)\approx rds3 \quad (7)$$

From an examination of the above, in output stage A1600 of operational amplifier 900 in the reference example of FIG. 1, fourth transistor M4 is switched ON and OFF depending on the value of load-driving current Iout, causing significant variation in voltage gain AV and output impedance Zout. This results in significant variation in transfer function, that is, gain and phase characteristics of the entire operational amplifier 900. As a result, the stability of a negative feedback circuit configured with operational amplifier 900 is compromised.

First Embodiment

Figure 4:
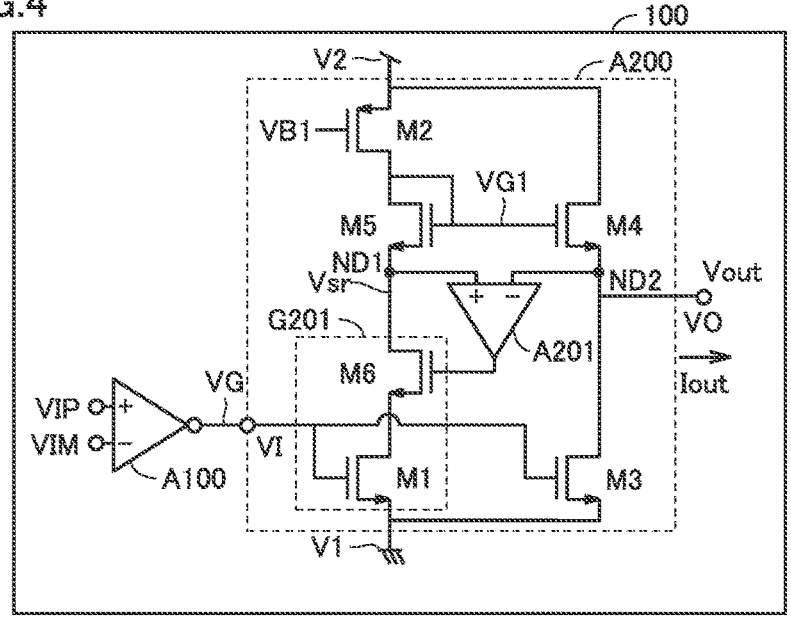
FIG. 4 represents a configuration of an operational amplifier 100 in a first embodiment.

FIG. 4 represents a configuration of an operational amplifier 100 in a first embodiment.

This operational amplifier 100 includes differential input stage A100 and an output stage A200.

Differential input stage A100 inverts and amplifies the difference between a first potential which is input to a non-inverted input terminal VIP and a second potential which is input to an inverted input terminal VIM, and outputs control voltage VG.

Output stage A200 is a class AB amplifier of source follower type capable of suppressing output impedance.

Output stage A200 includes input terminal VI, output terminal VO, a reference potential terminal V1, a reference potential terminal V2, first transistor M1 to sixth transistor M6, and a gain control amplifier A201. In the first embodiment, reference potential terminal V1 is a first reference potential terminal V1, and reference potential terminal V2 is a second reference potential terminal V2. First reference potential terminal V1 is lower in potential than second reference potential terminal V2.

Input terminal VI receives control voltage VG which is output from differential input stage A100.

First transistor M1 and third transistor M3 to sixth transistor M6 are each an N type MOSFET (Metal Oxide Semiconductor Field Effect Transistor). Second transistor M2 is a P type MOSFET. First transistor M1, second transistor M2, fifth transistor M5 and sixth transistor M6 form a replica amplifier. Third transistor M3 and fourth transistor M4 form a main amplifier.

First transistor M1, sixth transistor M6, fifth transistor M5 and second transistor M2 are connected in series between first reference potential terminal V1 and second reference potential terminal V2.

More specifically, first reference potential terminal V1 is connected to the source of first transistor M1. Second reference potential terminal V2 is connected to the source of second transistor M2. The drain of first transistor M1 and the source of sixth transistor M6 are connected to each other. The drain of sixth transistor M6 and the source of fifth transistor M5 are connected to each other at a first node ND1. The drain of fifth transistor M5 and the drain of second transistor M2 are connected to each other.

Third transistor M3 and fourth transistor M4 are connected in series between first reference potential terminal V1 and second reference potential terminal V2.

More specifically, first reference potential terminal V1 is connected to the source of third transistor M3. Second reference potential terminal V2 is connected to the drain of fourth transistor M4. The drain of third transistor M3 and the source of fourth transistor M4 are connected to a second node ND2. Second node ND2 is connected to output terminal VO.

The gate of first transistor M1 is connected to input terminal VI, and receives control voltage VG. The gate of second transistor M2 receives a bias voltage VB1. The gate of third transistor M3 is connected to input terminal VI, and receives control voltage VG. The gate of fourth transistor M4 is connected to the gate of fifth transistor M5 and the drain of fifth transistor M5, and receives output voltage VG1 from the replica amplifier. The gate of fifth transistor M5 is connected to the drain of fifth transistor M5 and the gate of fourth transistor M4, and receives output voltage VG1 from the replica amplifier. The gate of sixth transistor M6 is connected to a voltage output terminal of gain control amplifier A201.

Gain control amplifier A201 includes a non-inverted input terminal connected to first node ND1, an inverted input terminal connected to second node ND2, and a voltage output terminal connected to the gate of sixth transistor M6.

First transistor M1 is a replica of third transistor M3. Fifth transistor M5 is a replica of fourth transistor M4.

First transistor M1 has a gate length L1 and a gate width W1. Third transistor M3 has a gate length L3 and a gate width W3. Fourth transistor M4 has a gate length L4 and a gate width W4. Fifth transistor M5 has a gate length L5 and a gate width W5. The following relation holds:

$$(W3/L3)/(W1/L1)=(W4/L4)/(W5/L5)=N \tag{8}$$

where N is an integer.

Figure 5:
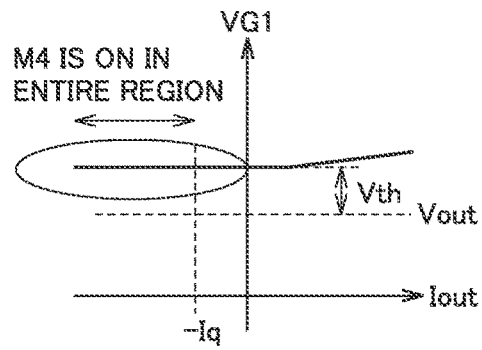
FIG. 5 represents relation between load-driving current Iout which is output from operational amplifier 100 and output voltage VG1 from the replica amplifier in the first embodiment.

FIG. 5 represents relation between load-driving current Iout which is output from operational amplifier 100 and output voltage VG1 from the replica amplifier in the first embodiment.

Figure 6:
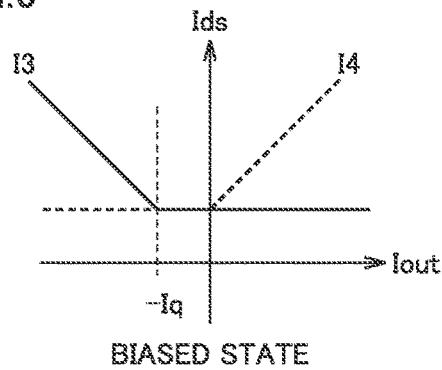
FIG. 6 represents relation between load-driving current Iout which is output from operational amplifier 100 and current Ids in the first embodiment.

FIG. 6 represents relation between load-driving current Iout which is output from operational amplifier 100 and current Ids in the first embodiment. Current Ids is current I3 flowing in third transistor M3 and current I4 flowing in fourth transistor M4.

Referring now to FIGS. 4 and 5, operation of output stage A200 is described.

<Biased State>

First, a biased state in which operational amplifier 100 is not driving the load is described.

The biased state corresponds to a state in which load-driving current Iout in FIGS. 5 and 6 is "0". In the biased state, current I3 flowing in third transistor M3 and current I4 flowing in fourth transistor M4 are equal to each other, causing load-driving current Iout which is output to the outside from output terminal VO to be zero.

First transistor M1 and third transistor M3 form a current mirror circuit. Thus, current I3 flowing in third transistor M3 and current I4 flowing in fourth transistor M4 are represented as follows using current I1 flowing in first transistor M1:

$$Iq=I4=I3=N \times I1 \tag{9}$$

In this equation, Iq assumes a positive value, and represents a quiescent current flowing in third transistor M3 and fourth transistor M4 in the biased state.

In this biased state, third transistor M3 and fourth transistor M4 are both biased to the ON state. Voltage Vout at output terminal VO is determined mainly by fourth transistor M4 having a source follower configuration with low output impedance. Specifically, control voltage VG which is output from differential input stage A100 is transferred from the gate to the drain of first transistor M1. The transferred voltage is further transferred from the gate to the source of fourth transistor M4, whereby output voltage Vout is determined.

In this biased state, the following relation holds between gate potential VG1 of fourth transistor M4 and output voltage Vout:

$$VG1=Vout+VGS4 \tag{10}$$

VGS4 represents a gate-source voltage of fourth transistor M4.

The following relation holds between gate potential VG1 of fourth transistor M4 and a source potential Vsr of fifth transistor M5:

$$VG1=Vsr+VGS5 \tag{11}$$

VGS5 represents a gate-source voltage of fifth transistor M5.

Here, the following holds from the equations (8) and (9):

$$VGS4=VGS5 \tag{12}$$

The following holds from the equations (10), (11) and (12):

$$Vout=Vsr \tag{13}$$

Gain control amplifier A201 controls a gate potential of sixth transistor M6 so as to allow first transistor M1 to operate in a saturation region.

First transistor M1 to sixth transistor M6 all operate in the saturation region by the operation described above.

<Load-Driven State>

Next, a load-driven state in which operational amplifier 100 is driving the load is described.

In the load-driven state, load-driving current Iout is supplied from output terminal VO to the load. Load-driving current Iout is supplied from either third transistor M3 or fourth transistor M4 depending on its direction. The direction in which load-driving current Iout flows from output terminal VO to the load is a positive direction. Currents I3 and I4 flowing in third transistor M3 and fourth transistor M4 are represented as follows depending on load-driving current Iout:

$$I3=Iq(Iout \geq -Iq) \tag{14-1}$$

$$I3=|Iout|(Iout<-Iq) \tag{14-2}$$

$$I4=Iq+Iout(Iout \geq 0) \tag{14-3}$$

$$I4=Iq(Iout<0) \tag{14-4}$$

As shown in the equations (14-1) to (14-4), third transistor M3 and fourth transistor M4 both assume a non-zero current value at all times. That is, third transistor M3 and fourth transistor M4 are maintained in the ON state at all times.

In operational amplifier 100, therefore, voltage Vout at output terminal VO is determined, as in the biased state, mainly by fourth transistor M4 having a source follower configuration with low output impedance. Specifically, control voltage VG which is output from differential input stage A100 is transferred from the gate to the drain of first transistor M1. The transferred voltage is further transferred from the gate to the source of fourth transistor M4, whereby output voltage Vout is determined.

Voltage gain AV from input terminal VI to output terminal VO of output stage A200 in the load-driven state is represented by the following equation:

$$AV \approx gM1 \times (rds1//rds2) \tag{15}$$

It is noted that gM1 represents a mutual conductance of first transistor M1. Rds1 represents a drain impedance of first transistor M1. Rds2 represents a drain impedance of second transistor M2. The sign // represents a combined impedance of two impedances connected in parallel.

Impedance Zout of output terminal VO is represented by the following equation:

$$Zout \approx 1/gM4 \tag{16}$$

It is noted that gM4 represents a mutual conductance of fourth transistor M4. It is assumed that the source follower formed by fourth transistor M4 has a voltage gain of 1 for brevity of description.

Next, a mechanism is further described in which fourth transistor M4 is maintained in the ON state at all times, particularly when Iout≤−Iq holds.

In the state of Iout≤−Iq, Iout is represented by the following equation:

$$Iout=-(Iq+\Delta Iq) \quad (17)$$

From the equations (9) and (14-2), current I1 in first transistor M1 and current I3 in third transistor M3 are represented as follows:

$$I1=Iq/N \quad (18)$$

$$I3=|Iout|=Iq+\Delta Iq \quad (19)$$

From the equations (18) and (19), the following relation holds between current I1 and current I3:

$$I3/I1=(Iq+\Delta Iq)/(Iq/N)>N \quad (20)$$

At this time, the following relation holds between currents I1 and I2 flowing in first transistor M1 and second transistor M2, respectively, when both transistors operate in the saturation region:

$$I1>I2 \quad (21)$$

Accordingly, first transistor M1 is reduced in drain potential, leading to the following:

$$VDS1<VGS1-Vth \quad (22a)$$

VDS1 represents a drain-source voltage of first transistor M1. VGS1 represents a gate-source voltage of first transistor M1. Vth represents a threshold voltage of first transistor M1.

Therefore, first transistor M1 operates in a non-saturation region, and fourth transistor M4 is turned off. On the other hand, it is assumed that output voltage Vout is set such that the following relation holds:

$$VDS3>VGS3-Vth=VGS1-Vth1 \quad (22b)$$

In this equation, VDS3 represents a drain-source voltage of third transistor M3. VGS3 represents a gate-source voltage of third transistor M3. Vth represents a threshold voltage of third transistor M3.

In this case, third transistor M3 operates in the saturation region, and the following relation holds between source potential Vsr of fifth transistor M5 and output voltage Vout:

$$Vsr<Vout \quad (22)$$

Output voltage Vout is determined independently of the operating states of first transistor M1 and second transistor M2, by the operation of a negative feedback circuit including operational amplifier 100.

When a difference arises between voltage Vsr which is input to the non-inverted input terminal and voltage Vout which is input to the inverted input terminal of gain control amplifier A201, gain control amplifier A201 causes a drop in gate voltage of sixth transistor M6 such that first transistor M1 operates in the non-saturation region and Vsr is equal to Vout. As a result, the following relation holds between current I5 in fifth transistor M5 and current I4 in fourth transistor M4:

$$I4=N\times I5 \quad (23)$$

Therefore, fourth transistor M4 can be maintained in the ON state.

Voltage Vout at output terminal VO of operational amplifier 100 in the first embodiment is determined at all times mainly by fourth transistor M4 having a source follower configuration with low output impedance. Specifically, control voltage VG which is output from differential input stage A100 is transferred from the gate to the drain of first transistor M1. The transferred voltage is further transferred from the gate to the source of fourth transistor M4, whereby output voltage Vout is determined, and source potential Vsr of fifth transistor M5 is equal to output voltage Vout. That is, voltage gains from input terminal VI of output stage A200 to a source terminal of fifth transistor M5, a gate terminal of fifth transistor M5, and a source terminal of fourth transistor M4 are all equal, leading to the following relation:

$$vsr/vg=vg1/vg=vout/vg \quad (24)$$

In this equation, vsr, vg1, vout and vg represent small signal voltages of VSR, VG1, Vout and VG.

Voltage gain AV from input terminal VI to output terminal VO of output stage A200 in this state is represented by the following equation:

$$AV \approx gM1\times(rds1//rds2) \quad (25)$$

GM1 represents a mutual conductance of first transistor M1. Rds1 represents a drain impedance of first transistor M1. Rds2 represents a drain impedance of second transistor M2.

Impedance Zout of output terminal VO is represented by the following equation:

$$Zout \approx 1/gM4 \quad (26)$$

GM4 represents a mutual conductance of fourth transistor M4. It is assumed that the source follower formed by fourth transistor M4 has a voltage gain of 1 for brevity of description.

From an examination of the above, in output stage A200 (class AB amplifier) shown in FIG. 4, fourth transistor M4 is maintained in the ON state regardless of the value of load-driving current Iout, so that variation in voltage gain AV and output impedance Zout can be suppressed even in the load-driven state.

As described above, according to the present embodiment, in the class AB amplifier having the replica amplifier and the main amplifier, the first to sixth transistors are maintained in the ON state even in the load-driven state, so that variation in voltage gain and output impedance depending on the value of the load-driving current can be prevented.

Variation of First Embodiment

In the first embodiment, first transistor M1 and third transistor M3 to sixth transistor M6 have been described as each being an N type MOSFET, the second transistor has been described as being a P type MOSFET, and furthermore, reference potential terminal V1 has been described as being lower in potential than reference potential terminal V2, they are not restrictive.

Figure 7:
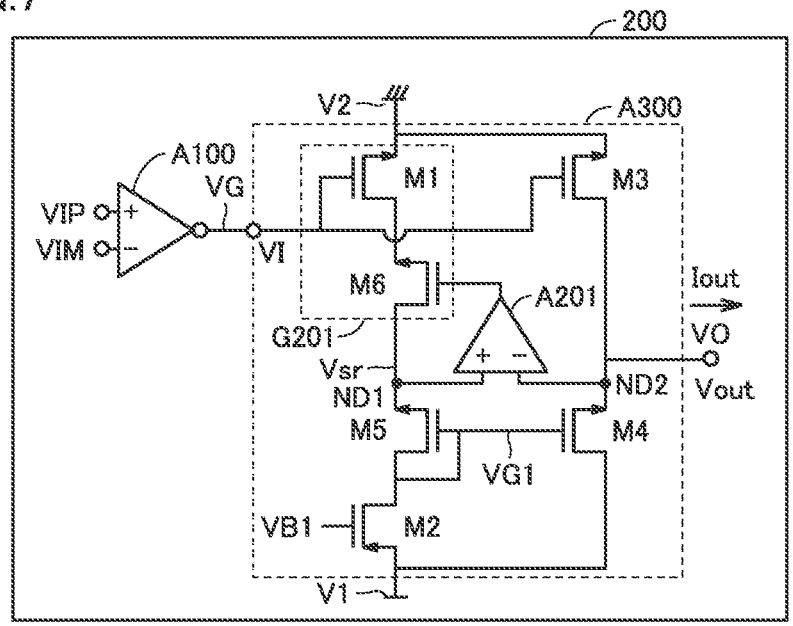
FIG. 7 represents a configuration of an operational amplifier 200 in a variation of the first embodiment.

FIG. 7 represents a configuration of an operational amplifier 200 in a variation of the first embodiment.

As shown in FIG. 7, the polarities (N type and P type) of the MOSFETs have been reversed, and reference potential terminal V1 is higher in potential than reference potential terminal V2.

This operational amplifier 200 includes differential input stage A100 and an output stage A300.

As in the first embodiment, differential input stage A100 inverts and amplifies the difference between a first potential which is input to non-inverted input terminal VIP and a second potential which is input to inverted input terminal VIM, and outputs control voltage VG.

Output stage A300 is a class AB amplifier of source follower type capable of suppressing output impedance.

Output stage A300 includes input terminal VI, output terminal VO, reference potential terminal V1, reference potential terminal V2, first transistor M1 to sixth transistor M6, and gain control amplifier A201. In the variation of the first embodiment, reference potential terminal V1 is a second reference potential terminal V1, and reference potential terminal V2 is a first reference potential terminal V2. Second reference potential terminal V1 is higher in potential than first reference potential terminal V2.

Input terminal VI receives control voltage VG which is output from differential input stage A100.

First transistor M1 and third transistor M3 to sixth transistor M6 are each a P type MOSFET. Second transistor M2 is an N type MOSFET. First transistor M1, second transistor M2, fifth transistor M5 and sixth transistor M6 form a replica amplifier. Third transistor M3 and fourth transistor M4 form a main amplifier. First transistor M1 and sixth transistor M6 form a gain controller of output stage A300.

Second transistor M2, fifth transistor M5, sixth transistor M6 and first transistor M1 are connected in series between second reference potential terminal V1 and first reference potential terminal V2.

More specifically, first reference potential terminal V2 is connected to the source of first transistor M1. Second reference potential terminal V1 is connected to the source of second transistor M2. The drain of first transistor M1 and the source of sixth transistor M6 are connected to each other. The drain of sixth transistor M6 and the source of fifth transistor M5 are connected to each other at first node ND1. The drain of fifth transistor M5 and the drain of second transistor M2 are connected to each other.

Third transistor M3 and fourth transistor M4 are connected in series between first reference potential terminal V2 and second reference potential terminal V1.

More specifically, first reference potential terminal V2 is connected to the source of third transistor M3. Second reference potential terminal V1 is connected to the drain of fourth transistor M4. The drain of third transistor M3 and the source of fourth transistor M4 are connected to second node ND2. Second node ND2 is connected to output terminal VO.

The gate of first transistor M1 is connected to input terminal VI, and receives control voltage VG. The gate of second transistor M2 receives bias voltage VB1. The gate of third transistor M3 is connected to input terminal VI, and receives control voltage VG. The gate of fourth transistor M4 is connected to the gate of fifth transistor M5 and the drain of fifth transistor M5, and receives output voltage VG1 from the replica amplifier. The gate of fifth transistor M5 is connected to the drain of fifth transistor M5 and the gate of fourth transistor M4, and receives output voltage VG1 from the replica amplifier. The gate of sixth transistor M6 is connected to the voltage output terminal of gain control amplifier A201.

Gain control amplifier A201 includes a non-inverted input terminal connected to the source of fifth transistor M5, an inverted input terminal connected to the source of fourth transistor M4, and a voltage output terminal connected to the gate of sixth transistor M6.

First transistor M1 is a replica of third transistor M3. Fifth transistor M5 is a replica of fourth transistor M4.

First transistor M1 has a gate length L1 and a gate width W1. Third transistor M3 has a gate length L3 and a gate width W3. Fourth transistor M4 has a gate length L4 and a gate width W4. Fifth transistor M5 has a gate length L5 and a gate width W5. The following relation holds:

$$(W3/L3)/(W1/L1)=(W4/L4)/(W5/L5)=N \qquad (8)$$

where N is an integer.

Operation of operational amplifier 200 is similar the operation of operational amplifier 100 in the first embodiment, and is therefore not described again.

As described above, also in the case where the polarities (N type and P type) of the MOSFETs and the magnitude relation between the potential of reference potential terminal V1 and the potential of reference potential terminal V2 in the first embodiment are reversed, effects similar to those of the first embodiment are produced.

Second Embodiment

Figure 8:
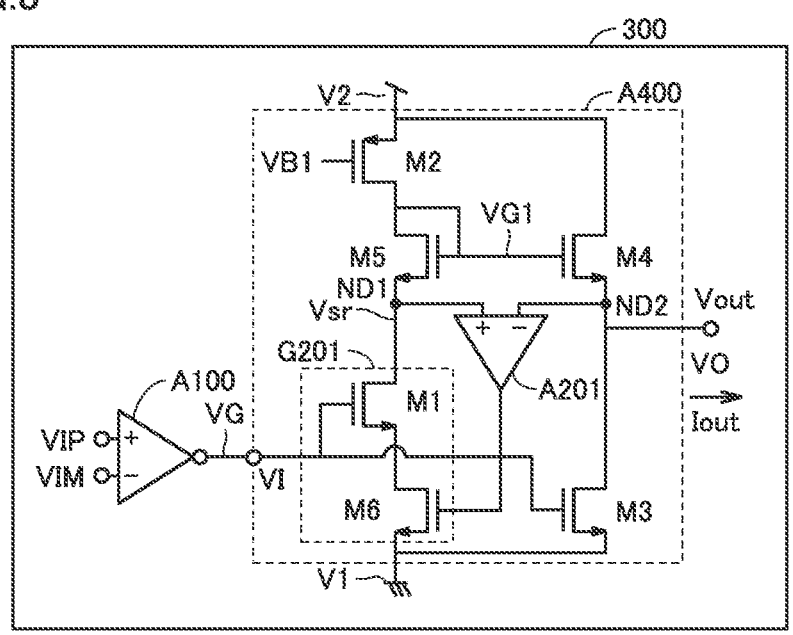
FIG. 8 represents a configuration of an operational amplifier 300 in a second embodiment.

FIG. 8 represents a configuration of an operational amplifier 300 in a second embodiment.

Operational amplifier 300 includes differential input stage A100 and an output stage A400.

Output stage A400 in the second embodiment is identical to output stage A200 in the first embodiment except that first transistor M1 and sixth transistor M6 have been reversed.

As in the first embodiment, differential input stage A100 inverts and amplifies the difference between a first potential which is input to non-inverted input terminal VIP and a second potential which is input to inverted input terminal VIM, and outputs control voltage VG.

Output stage A400 is a class AB amplifier of source follower type capable of suppressing output impedance.

Output stage A400 includes input terminal VI, output terminal VO, reference potential terminal V1, reference potential terminal V2, first transistor M1 to sixth transistor M6, and gain control amplifier A201. In the second embodiment, reference potential terminal V1 is first reference potential terminal V1, and reference potential terminal V2 is second reference potential terminal V2. First reference potential terminal V1 is lower in potential than second reference potential terminal V2.

Input terminal VI receives control voltage VG which is output from differential input stage A100.

First transistor M1 and third transistor M3 to sixth transistor M6 are each an N type MOSFET. Second transistor M2 is a P type MOSFET. First transistor M1, second transistor M2, fifth transistor M5 and sixth transistor M6 form a replica amplifier. Third transistor M3 and fourth transistor M4 form a main amplifier.

Sixth transistor M6, first transistor M1, fifth transistor M5 and second transistor M2 are connected in series between first reference potential terminal V1 and second reference potential terminal V2.

More specifically, first reference potential terminal V1 is connected to the source of sixth transistor M6. Second reference potential terminal V2 is connected to the source of second transistor M2. The drain of sixth transistor M6 and the source of first transistor M1 are connected to each other. The drain of first transistor M1 and the source of fifth transistor M5 are connected to each other at first node ND1. The drain of fifth transistor M5 and the drain of second transistor M2 are connected to each other.

Third transistor M3 and fourth transistor M4 are connected in series between first reference potential terminal V1 and second reference potential terminal V2.

More specifically, first reference potential terminal V1 is connected to the source of third transistor M3. Second reference potential terminal V2 is connected to the drain of fourth transistor M4. The drain of third transistor M3 and the source of fourth transistor M4 are connected to second node ND2. Second node ND2 is connected to output terminal VO.

The gate of first transistor M1 is connected to input terminal VI, and receives control voltage VG. The gate of second transistor M2 receives bias voltage VB1. The gate of third transistor M3 is connected to input terminal VI, and receives control voltage VG. The gate of fourth transistor M4 is connected to the gate of fifth transistor M5 and the drain of fifth transistor M5, and receives output voltage VG1 from the replica amplifier. The gate of fifth transistor M5 is connected to the drain of fifth transistor M5 and the gate of fourth transistor M4, and receives output voltage VG1 from the replica amplifier. The gate of sixth transistor M6 is connected to the voltage output terminal of gain control amplifier A201.

Gain control amplifier A201 includes a non-inverted input terminal connected to first node ND1, an inverted input terminal connected to second node ND2, and a voltage output terminal connected to the gate of sixth transistor M6.

Sixth transistor M6 is a replica of third transistor M3. Fifth transistor M5 is a replica of fourth transistor M4.

Sixth transistor M6 has a gate length L6 and a gate width W6. Third transistor M3 has a gate length L3 and a gate width W3. Fourth transistor M4 has a gate length L4 and a gate width W4. Fifth transistor M5 has a gate length L5 and a gate width W5. The following relation holds:

$$(W3/L3)/(W6/L6)=(W4/L4)/(W5/L5)=N \quad (8A)$$

where N is an integer.

When a difference arises between voltage Vsr which is input to the non-inverted input terminal and voltage Vout which is input to the inverted input terminal of gain control amplifier A201, gain control amplifier A201 causes a drop in gate voltage of sixth transistor M6 such that first transistor M1 operates in the non-saturation region and Vsr is equal to Vout. As a result, the following relation holds between currents I5 and I4 in fifth transistor M5 and fourth transistor M4:

$$I4=N \times I5 \quad (23)$$

As a result, the fourth transistor can be maintained in the ON state.

Sixth transistor M6 is controlled to be in a non-saturated state by gain control amplifier A201 and operates as a variable resistor.

Gain control amplifier A201 lowers the gain when the state of Iout≤−Iq occurs. Gain control amplifier A201 and sixth transistor M6 lower a drain voltage of first transistor M1, causing first transistor M1 to operate in the non-saturation region. As a result, first transistor M1 does not pass a current of a magnitude higher than or equal to the current supplied from second transistor M2. Voltage VG1 is thereby maintained at a voltage that allows fourth transistor M4 to be maintained in the ON state.

As a result, fourth transistor M4 is maintained in the ON state, so that variation in voltage gain AV and output impedance Zout can be suppressed even in the load-driven state.

As described above, also in the case where the first transistor and the sixth transistor between first reference potential terminal V1 and second reference potential terminal V2 in the first embodiment are reversed in position, effects similar to those of the first embodiment are produced.

Variation of Second Embodiment

Figure 9:
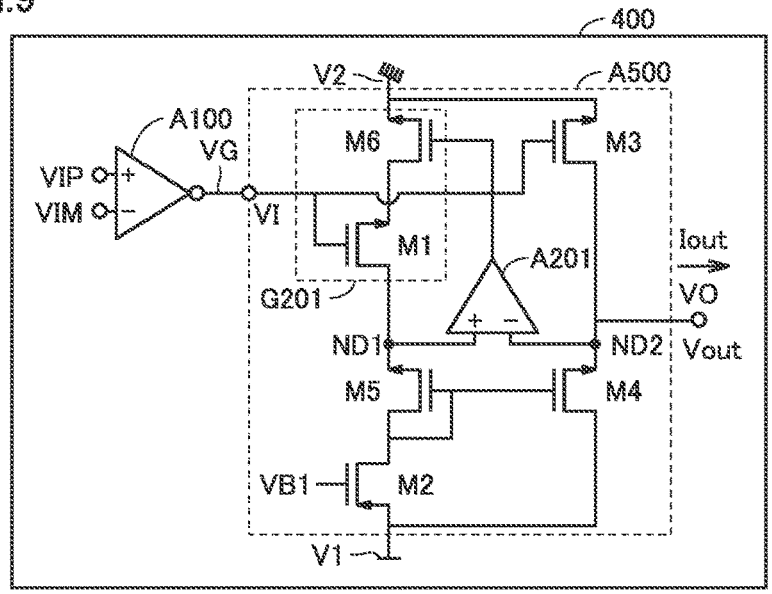
FIG. 9 represents a configuration of an operational amplifier 400 in a variation of the second embodiment.

FIG. 9 represents a configuration of an operational amplifier 400 in a variation of the second embodiment.

This operational amplifier 400 includes differential input stage A100 and an output stage A500.

Output stage A500 is a class AB amplifier of source follower type capable of suppressing output impedance.

As in the first embodiment, differential input stage A100 inverts and amplifies the difference between a first potential which is input to non-inverted input terminal VIP and a second potential which is input to inverted input terminal VIM, and outputs control voltage VG.

Output stage A500 includes input terminal VI, output terminal VO, reference potential terminal V1, reference potential terminal V2, first transistor M1 to sixth transistor M6, and gain control amplifier A201.

In the second embodiment, first transistor M1 and third transistor M3 to sixth transistor M6 are each an N type MOSFET, the second transistor is a P type MOSFET, and furthermore, reference potential terminal V1 is lower in potential than reference potential terminal V2.

In contrast, in this variation, the polarities (N type and P type) of the MOSFETs have been reversed, and reference potential terminal V1 is higher in potential than reference potential terminal V2, as shown in FIG. 9. Also in this variation, effects similar to those of the second embodiment are produced.

Third Embodiment

Figure 10:
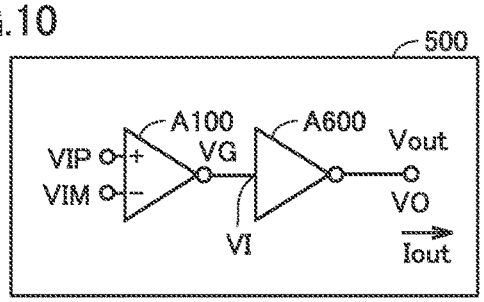
FIG. 10 is a schematic diagram of a configuration of an operational amplifier 500 in a third embodiment.

FIG. 10 is a schematic diagram of a configuration of an operational amplifier 500 in a third embodiment.

Operational amplifier 500 includes differential input stage A100 and an output stage A600.

As in the first embodiment, differential input stage A100 inverts and amplifies the difference between a first potential which is input to non-inverted input terminal VIP and a second potential which is input to inverted input terminal VIM, and outputs control voltage VG.

Output stage A600 has input terminal VI for receiving control voltage VG. Output stage A600 amplifies control voltage VG, and outputs output voltage Vout to output terminal VO.

By employing the class AB amplifier in the first embodiment or the second embodiment for output stage A600, variation in transfer function, that is, gain and phase characteristics of the operational amplifier depending on the value of load-driving current Iout can be suppressed. Thus, satisfactory stability of a negative feedback circuit configured with the operational amplifier can be ensured.

Figure 11:
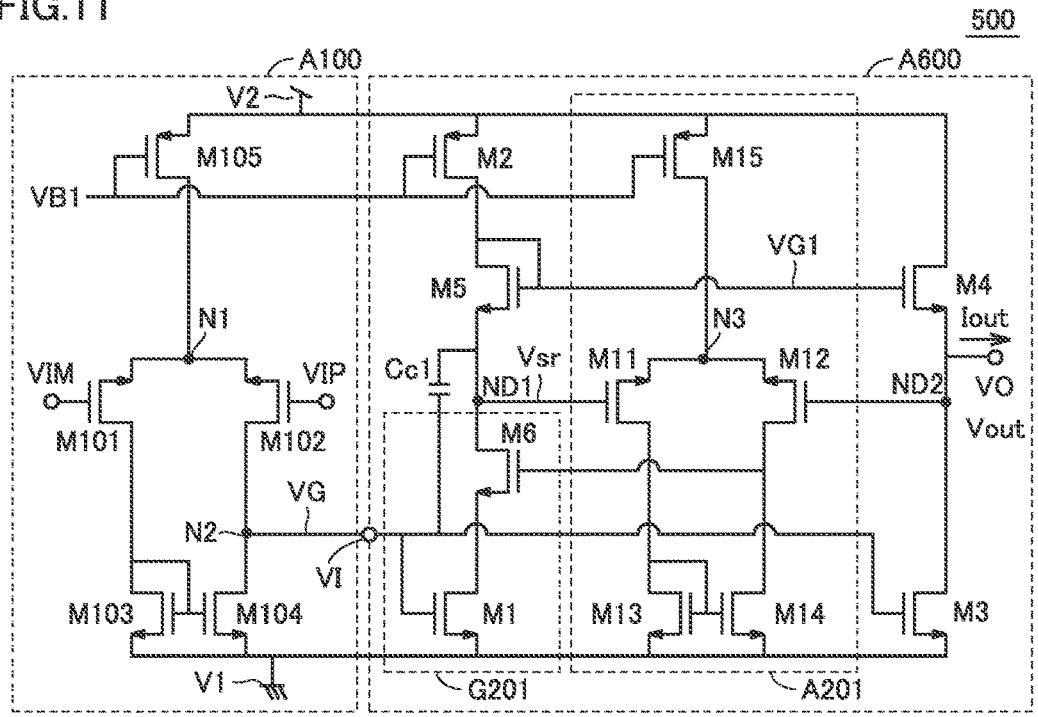
FIG. 11 is a circuit diagram of operational amplifier 500 in the third embodiment.

FIG. 11 is a circuit diagram of operational amplifier 500 in the third embodiment.

Differential input stage A100 includes a transistor M105, and transistors M101, M102, M103, M104. Transistor M105 is a P type MOSFET. Transistors M101, M102, M103 and M104 are each an N type MOSFET.

Transistor M105 includes a source connected to second reference potential terminal V2, a drain connected to a node N1, and a gate for receiving bias voltage VB1.

Transistor M101 includes a source connected to node N1, a drain connected to the drain of transistor M103, and a gate connected to inverted input terminal VIM.

Transistor M102 includes a source connected to node N1, a drain connected to a node N2, and a gate connected to non-inverted input terminal VIP.

Transistor M103 includes a source connected to first reference potential terminal V1, a drain connected to the drain of transistor M101, and a gate connected to the gate of transistor M104 and the drain of transistor M103.

Transistor M104 includes a source connected to first reference potential terminal V1, a drain connected to node N2, and a gate connected to the gate of transistor M103 and the drain of transistor M103.

Control voltage VG is output from node N2.

Output stage A600 excluding gain control amplifier A201 has a similar configuration to output stage A200 in FIG. 4, except that output stage A600 includes a capacitive element Cc1. Capacitive element Cc1 is connected between the source of fifth transistor M5 and input terminal VI. Capacitive element Cc1 is provided for phase compensation.

Gain control amplifier A201 includes a transistor M15 and transistors M11, M12, M13, M14. Transistor M15 is a P type MOSFET. Transistors M11, M12, M13 and M14 are each an N type MOSFET.

Transistor M15 includes a source connected to second reference potential terminal V2, a drain connected to a node N3, and a gate for receiving bias voltage VB1.

Transistor M11 includes a source connected to node N3, a drain connected to the drain of transistor M13, and a gate for receiving voltage Vsr.

Transistor M12 includes a source connected to node N3, a drain connected to the gate of sixth transistor M6, and a gate connected to output terminal VO.

Transistor M13 includes a source connected to first reference potential terminal V1, a drain connected to the drain of transistor M11, and a gate connected to the gate of transistor M14 and the drain of transistor M13.

Transistor M14 includes a source connected to first reference potential terminal V1, a drain connected to the drain of transistor M12, and a gate connected to the gate of transistor M13.

Fourth Embodiment

Figure 12:
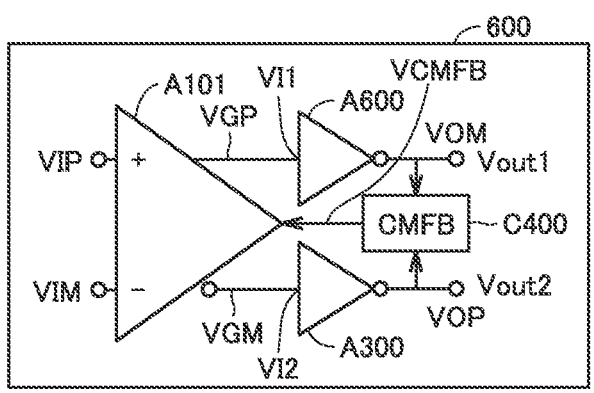
FIG. 12 is a schematic diagram of a configuration of an operational amplifier 600 in a fourth embodiment.

FIG. 12 is a schematic diagram of a configuration of an operational amplifier 600 in a fourth embodiment.

Operational amplifier 600 includes a differential input stage A101, output stage A600, output stage A300, and a common mode feedback amplifier (CMFB) C400.

Differential input stage A101 inverts and amplifies the difference between a first potential which is input to non-inverted input terminal VIP and a second potential which is input to inverted input terminal VIM, and outputs a non-inverted intermediate voltage VGP and an inverted intermediate voltage VGM.

Output stage A600 has an input terminal VI1 for receiving non-inverted intermediate voltage VGP. Output stage A600 inverts and amplifies non-inverted intermediate voltage VGP, and outputs an inverted output voltage Vout1 from an inverted output terminal VOM.

Output stage A300 has an input terminal VI2 for receiving inverted intermediate voltage VGM. Output stage A300 amplifies inverted intermediate voltage VGM, and outputs a non-inverted output voltage Vout2 from a non-inverted output terminal VOP.

Common mode feedback amplifier (CMFB) C400 receives non-inverted output voltage Vout2 and inverted output voltage Vout1, generates a common mode feedback voltage VCMFB for controlling differential input stage A101 such that an intermediate voltage between non-inverted output voltage Vout2 and inverted output voltage Vout1 matches a reference voltage, and sends common mode feedback voltage VCMFB to differential input stage A101.

Figure 13:
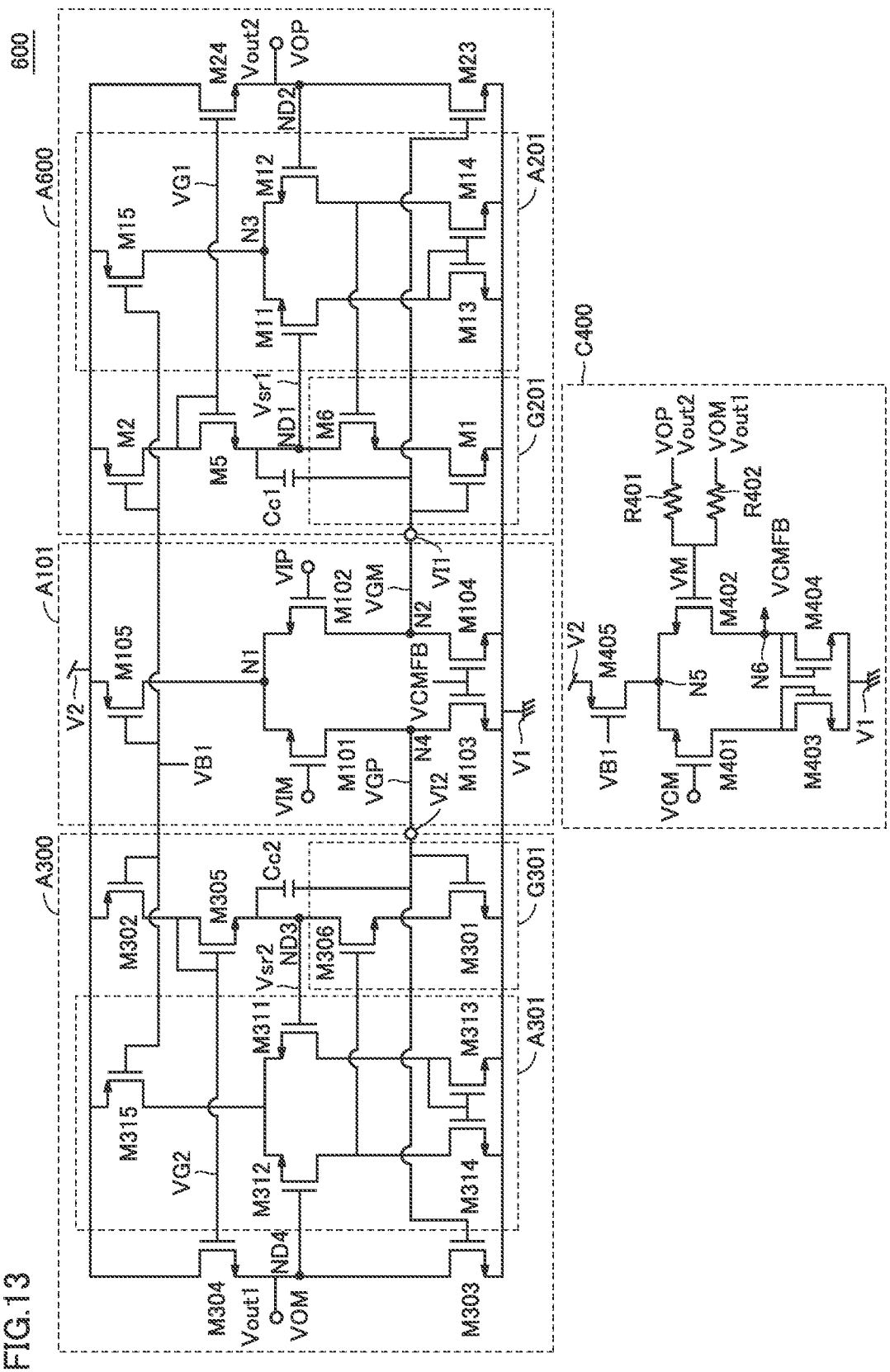
FIG. 13 is a circuit diagram of operational amplifier 600 in the fourth embodiment.

FIG. 13 is a circuit diagram of operational amplifier 600 in the fourth embodiment.

In FIG. 13, output stage A600 has a similar configuration to output stage A600 in FIG. 11, except that the input terminal has been changed from VI to VI1, the output terminal has been changed from VO to non-inverted output terminal VOP, and voltage Vsr has been changed to Vsr1.

Output stage A300 has a similar configuration to and operates similarly to output stage A600.

Output stage A300 is a class AB amplifier of source follower type capable of suppressing output impedance.

Output stage A300 includes input terminal VI2, inverted output terminal VOM, a first transistor M301, a second transistor M302, a third transistor M303, a fourth transistor M304, a fifth transistor M305, a sixth transistor M306, a capacitive element Cc2, and a gain control amplifier A301.

Input terminal VI2 receives inverted intermediate voltage VGM which is output from differential input stage A101.

First transistor M301 and third transistor M303 to sixth transistor M306 are each an N type MOSFET. Second transistor M302 is a P type MOSFET. First transistor M301, second transistor M302, fifth transistor M305 and sixth transistor M306 form a replica amplifier. Third transistor M303 and fourth transistor M304 form a main amplifier. First transistor M301 and sixth transistor M306 form a gain controller G301 of output stage A300.

First transistor M301, sixth transistor M306, fifth transistor M305 and second transistor M302 are connected in series between first reference potential terminal V1 and second reference potential terminal V2.

More specifically, first reference potential terminal V1 is connected to the source of first transistor M301. Second reference potential terminal V2 is connected to the source of second transistor M302. The drain of first transistor M301 and the source of sixth transistor M306 are connected to each other. The drain of sixth transistor M306 and the source of fifth transistor M305 are connected to each other at a third node ND3. The drain of fifth transistor M305 and the drain of second transistor M302 are connected to each other.

Third transistor M303 and fourth transistor M304 are connected in series between first reference potential terminal V1 and second reference potential terminal V2.

More specifically, first reference potential terminal V1 is connected to the source of third transistor M303. Second reference potential terminal V2 is connected to the drain of fourth transistor M304. The drain of third transistor M303 and the source of fourth transistor M304 are connected to a fourth node ND4. Fourth node ND4 is connected to inverted output terminal VOM.

The gate of first transistor M301 is connected to input terminal VI2, and receives non-inverted intermediate voltage VGP. The gate of second transistor M302 receives bias voltage VB1. The gate of third transistor M303 is connected to input terminal VI2, and receives non-inverted intermediate voltage VGP. The gate of fourth transistor M304 is connected to the gate of fifth transistor M305 and the drain of fifth transistor M305, and receives an output voltage VG2 from the replica amplifier. The gate of fifth transistor M305 is connected to the drain of fifth transistor M305 and the gate of fourth transistor M304, and receives output voltage VG2 from the replica amplifier. The gate of sixth transistor M306 is connected to a voltage output terminal of gain control amplifier A301.

First transistor M301 has a gate length L1 and a gate width W1. Third transistor M303 has a gate length L3 and a gate width W3. Fourth transistor M304 has a gate length L4 and a gate width W4. Fifth transistor M305 has a gate length L5 and a gate width W5. The following relation holds:

$(W3/L3)/(W1/L1)=(W4/L4)/(W5/L5)=N$ (8)

where N is an integer.

Gain control amplifier A301 includes a transistor M315, and transistors M311, M312, M313, M314. Transistor M315 is a P type MOSFET. Transistors M311, M312, M313 and M314 are each an N type MOSFET.

Transistor M315 includes a source connected to second reference potential terminal V2, a drain connected to a node N13, and a gate for receiving bias voltage VB1.

Transistor M311 includes a source connected to node N13, a drain connected to the drain of transistor M313, and a gate for receiving a voltage Vsr2.

Transistor M312 includes a source connected to node N13, a drain connected to the gate of sixth transistor M306, and a gate connected to inverted output terminal VOM.

Transistor M313 includes a source connected to first reference potential terminal V1, a drain connected to the drain of transistor M311, and a gate connected to the gate of transistor M314 and the drain of transistor M313.

Transistor M314 includes a source connected to first reference potential terminal V1, a drain connected to the drain of transistor M312, and a gate connected to the gate of transistor M313.

Differential input stage A101 includes transistor M105, and transistors M101, M102, M103, M104. Transistor M105 is a P type MOSFET. Transistors M101, M102, M103 and M104 are each an N type MOSFET.

Transistor M105 includes a source connected to second reference potential terminal V2, a drain connected to node N1, and a gate for receiving bias voltage VB1.

Transistor M101 includes a source connected to node N1, a drain connected to a node N4, and a gate connected to inverted input terminal VIM.

Transistor M102 includes a source connected to node N1, a drain connected to node N2, and a gate connected to non-inverted input terminal VIP.

Transistor M103 includes a source connected to first reference potential terminal V1, a drain connected to node N4, and a gate for receiving common mode feedback voltage VCMFB. Inverted intermediate voltage VGM is output from node N4. Inverted intermediate voltage VGM is supplied to input terminal VI2 of output stage A300.

Transistor M104 includes a source connected to first reference potential terminal V1, a drain connected to node N2, and a gate for receiving common mode feedback voltage VCMFB. Inverted intermediate voltage VGM is output from node N2. Inverted intermediate voltage VGM is supplied to input terminal VI1 of output stage A200.

Common mode feedback amplifier C400 includes a transistor M405, transistors M401, M402, M403, M404, and resistive elements R401, R402. Transistor M405 is a P type MOSFET. Transistors M401, M402, M403 and M404 are each an N type MOSFET.

Resistive element R401 has one end connected to non-inverted output terminal VOP, for receiving non-inverted output voltage Vout2. Resistive element R402 has one end connected to inverted output terminal VOM, for receiving inverted output voltage Vout1. Each of resistive element R401 and resistive element R402 has the other end connected to the gate of transistor M402. An intermediate voltage VM {=(Vout1+Vout2)/2} between non-inverted output voltage Vout2 and inverted output voltage Vout1 is supplied to the gate of transistor M402 by resistive element R401 and resistive element R402.

Transistor M405 includes a source connected to second reference potential terminal V2, a drain connected to a node N5, and a gate for receiving bias voltage VB1.

Transistor M401 includes a source connected to node N5, a drain connected to the drain of transistor M403, and a gate for receiving reference voltage VCM.

Transistor M402 includes a source connected to node N5, a drain connected to a node N6, and a gate for receiving intermediate voltage VM.

Transistor M403 includes a source connected to first reference potential terminal V1, a drain connected to the drain of transistor M401, and a gate connected to the drain of transistor M403.

Transistor M404 includes a source connected to first reference potential terminal V1, a drain connected to node N6, and a gate connected to the drain of transistor M404.

Common mode feedback voltage VCMFB is output from node N6 and sent to differential input stage A101.

If intermediate voltage VM is higher than reference voltage VCM, for example, common mode feedback amplifier (CMFB) C400 lowers the magnitude of common mode feedback voltage VCMFB. Common mode feedback amplifier C400 operates to thereby increase the gate voltage of a transistor M23 and transistor M303 to lower output voltages Vout1 and Vout2.

As described above, according to the present embodiment, a complete differential operational amplifier can be realized using the class AB amplifier described in the first embodiment, the variation of the first embodiment, the second embodiment, the variation of the second embodiment.

Fifth Embodiment

Figure 14:
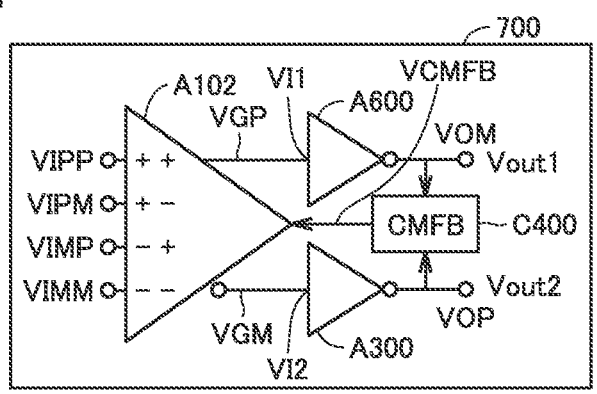
FIG. 14 is a schematic diagram of a configuration of an operational amplifier 700 in a fifth embodiment.

FIG. 14 is a schematic diagram of a configuration of an operational amplifier 700 in a fifth embodiment.

Operational amplifier 700 includes a differential input stage A102, output stage A600, output stage A300, and common mode feedback amplifier (CMFB) C400.

Output stage A600, output stage A300 and common mode feedback amplifier C400 are similar to those described in the fourth embodiment.

Differential input stage A102 is a double differential output amplifier having two differential pairs, each of which receives a differential input voltage. Specifically, differential input stage A102 amplifies the difference between a first potential which is input to a first non-inverted input terminal VIPP and a second potential which is input to a first inverted input terminal VIPM. Differential input stage A102 amplifies the difference between a third potential which is input to a second non-inverted input terminal VIMP and a fourth potential which is input to a second inverted input terminal VIMM. Differential input stage A102 adds the two amplified voltage differences, and outputs inverted intermediate voltage VGM and non-inverted intermediate voltage VGP.

Figure 15:
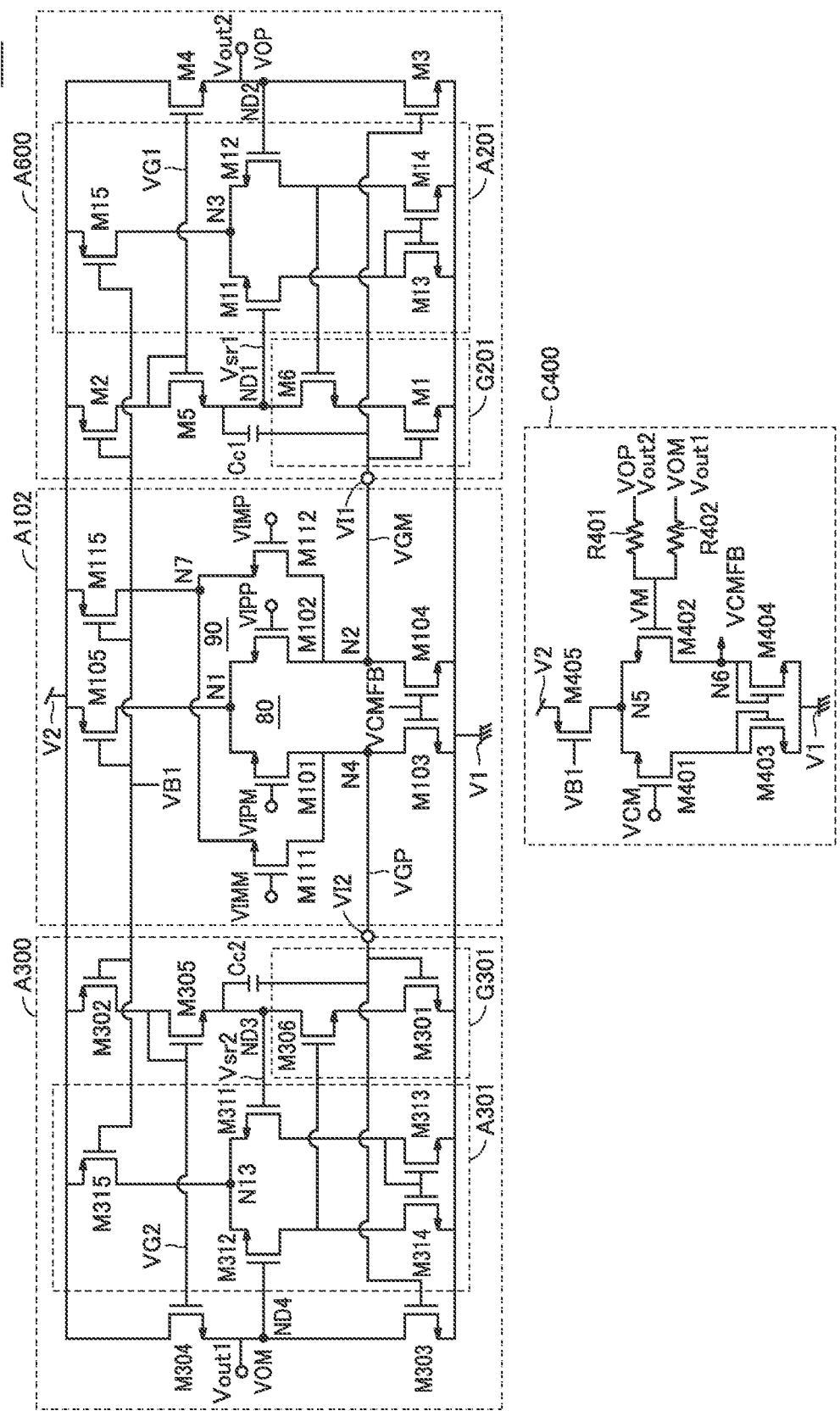
FIG. 15 is a circuit diagram of operational amplifier 700 in the fifth embodiment.

FIG. 15 is a circuit diagram of operational amplifier 700 in the fifth embodiment.

In FIG. 15, output stages A600 and A300 have similar configurations to output stages A600 and A300 in FIG. 13. Common mode feedback amplifier C400 has a similar configuration to common mode feedback amplifier C400 in FIG. 13.

Differential input stage A102 includes a first differential pair 80, a second differential pair 90, and transistors M105, M115, M103, M104. First differential pair 80 includes transistor M101 and transistor M102. Second differential pair 90 includes a transistor M111 and a transistor M112.

Transistors M105 and M115 are each a P type MOSFET. Transistors M101, M102, M103, M104, M111 and M112 are each an N type MOSFET.

Transistor M105 includes a source connected to second reference potential terminal V2, a drain connected to node N1, and a gate for receiving bias voltage VB1.

Transistor M115 includes a source connected to second reference potential terminal V2, a drain connected to a node N7, and a gate for receiving bias voltage VB1.

Transistor M101 includes a source connected to node N1, a drain connected to node N4, and a gate connected to first inverted input terminal VIPM.

Transistor M102 includes a source connected to node N1, a drain connected to node N2, and a gate for receiving first non-inverted input terminal VIPP.

Transistor M111 includes a source connected to node N7, a drain connected to node N4, and a gate connected to second inverted input terminal VIMM.

Transistor M112 includes a source connected to node N7, a drain connected to node N2, and a gate connected to second non-inverted input terminal VIMP.

An output current from first differential pair 80 formed of transistors M101 and M102 and an output current from second differential pair 90 formed of transistors M111 and M112 are added at transistor M103 and transistor M104 serving as active loads.

Transistor M103 includes a source connected to first reference potential terminal V1, a drain connected to node N4, and a gate for receiving common mode feedback voltage VCMFB. Non-inverted intermediate voltage VGP is output from node N4. Non-inverted intermediate voltage VGP is supplied to output stage A300.

Transistor M104 includes a source connected to first reference potential terminal V1, a drain connected to node N2, and a gate for receiving common mode feedback voltage VCMFB. Inverted intermediate voltage VGM is output from node N2. Inverted intermediate voltage VGM is supplied to output stage A600.

As described above, according to the present embodiment, a multi-input complete differential operational amplifier can be realized using the class AB amplifier described in the first embodiment, the variation of the first embodiment, the second embodiment, the variation of the second embodiment.

While an output stage forming the class AB amplifier in the first embodiment is provided at output stages A600 and A300, an output stage forming the class AB amplifier according to the variation of the first embodiment, the second embodiment, or the variation of the second embodiment may be provided.

While each of the transistors has been described as being configured as a MOSFET in the first to fifth embodiments, this is not restrictive. Of course, each of the transistors in the first to fifth embodiments can partially or completely be configured using a bipolar transistor.

It should be understood that the embodiments disclosed herein are illustrative and non-restrictive in every respect. The scope of the present disclosure is defined by the terms of the claims, rather than the description above, and is intended to include any modifications within the meaning and scope equivalent to the terms of the claims.

REFERENCE SIGNS LIST 100, 200, 300, 400, 500, 600, 700, 900 operational amplifier; VIP, VIM, VIPP, VIPM, VIMP, VIMM differential input terminal; VI, VI1, VI2 input terminal; VO, VOP, VOM output terminal; A100, A101, A102 differential input stage; A200, A300, A400, A500, A600, A1600 output stage (class AB amplifier); A201, A301 gain control amplifier; C400 common mode feedback amplifier; G201, G301 gain controller of class AB amplifier; R401, R402 resistive element; Cc, Cc1, Cc2 capacitive element; M1 to M6, M11 to M15, M101 to M105, M111 to M115, M301 to M306, M311 to M315, M401 to M405 transistor.

The invention claimed is:

1. A class AB amplifier comprising:
an input terminal;
an output terminal;
a first reference potential terminal;
a second reference potential terminal;
a first transistor, a second transistor, a third transistor, a fourth transistor, a fifth transistor and a sixth transistor; and
a gain control amplifier having an inverted input terminal, a non-inverted input terminal and a voltage output terminal,
the first transistor, the third transistor, the fourth transistor, the fifth transistor and the sixth transistor each being a first conductivity type transistor, and the second transistor being a second conductivity type transistor,
a second main electrode of the first transistor and a first main electrode of the sixth transistor being connected to each other, a second main electrode of the sixth transistor and a first main electrode of the fifth transistor being connected to each other at a first node, a second main electrode of the fifth transistor and a second main electrode of the second transistor being connected to each other, and a control electrode of the fifth transistor and the second main electrode of the fifth transistor being connected to each other,
a second main electrode of the third transistor and a first main electrode of the fourth transistor being connected to each other at a second node, the second node being connected to the output terminal,
a control electrode of the fourth transistor and the control electrode of the fifth transistor being connected to each other,
the first reference potential terminal being connected to a first main electrode of the second transistor and a second main electrode of the fourth transistor,
the second reference potential terminal being connected to a first main electrode of the first transistor and a first main electrode of the third transistor,
the input terminal being connected to a control electrode of the first transistor and a control electrode of the third transistor,
the non-inverted input terminal of the gain control amplifier being connected to the first node, the inverted input terminal of the gain control amplifier being connected to the second node, and the voltage output terminal of the gain control amplifier being connected to a control electrode of the sixth transistor, wherein
the gain control amplifier controls a voltage supplied to the control electrode of the sixth transistor such that the first node and the second node are equal in voltage.

2. The class AB amplifier according to claim 1, wherein the first transistor, the second transistor, the third transistor, the fourth transistor, the fifth transistor and the sixth transistor are each a MOS transistor, and
assuming that the first transistor, the third transistor, the fourth transistor and the fifth transistor have gate lengths L1, L3, L4 and L5, respectively, and the first transistor, the third transistor, the fourth transistor and the fifth transistor have gate widths W1, W3, W4 and W5, respectively, the following relation holds:

$$(W3/L3)/(W1/L1)=(W4/L4)/(W5/L5)=N$$

where N is an integer.

3. The class AB amplifier according to claim 2, wherein the first main electrode of each of the first transistor, the second transistor, the third transistor, the fourth transistor, the fifth transistor and the sixth transistor is a source, and
the second main electrode of each of the first transistor, the second transistor, the third transistor, the fourth transistor, the fifth transistor and the sixth transistor is a drain.

4. The class AB amplifier according to claim 3, wherein the first conductivity type transistor is an N type MOS transistor, and the second conductivity type transistor is a P type MOS transistor.

5. The class AB amplifier according to claim 3, wherein the first conductivity type transistor is a P type MOS transistor, and the second conductivity type transistor is an N type MOS transistor.

6. An operational amplifier comprising:
a differential input stage to invert and amplify a difference between a first potential and a second potential, and output a control voltage; and
an output stage to amplify the control voltage,
the output stage being configured as the class AB amplifier according to claim 1.

7. An operational amplifier comprising:
a differential input stage having a non-inverted input terminal and an inverted input terminal, to invert and amplify a difference between a potential at the non-inverted input terminal and a potential at the inverted input terminal, and output a non-inverted intermediate voltage and an inverted intermediate voltage;
a first output stage to amplify the non-inverted intermediate voltage and output an inverted output voltage;
a second output stage to amplify the inverted intermediate voltage and output a non-inverted output voltage; and
a common mode feedback amplifier to receive the non-inverted output voltage and the inverted output voltage, and control the differential input stage such that an intermediate voltage between the non-inverted output voltage and the inverted output voltage matches a reference voltage, and
the first output stage and the second output stage each being configured as the class AB amplifier according to claim 1.

8. The operational amplifier according to claim 7, wherein the differential input stage is a double differential amplifier having two differential pairs, each of which receives a differential input voltage.

9. A class AB amplifier comprising:
an input terminal;
an output terminal;
a first reference potential terminal;
a second reference potential terminal;
a first transistor, a second transistor, a third transistor, a fourth transistor, a fifth transistor and a sixth transistor; and
a gain control amplifier having an inverted input terminal, a non-inverted input terminal and a voltage output terminal,
the first transistor, the third transistor, the fourth transistor, the fifth transistor and the sixth transistor each being a first conductivity type transistor, and the second transistor being a second conductivity type transistor,
a second main electrode of the sixth transistor and a first main electrode of the first transistor being connected to each other, a second main electrode of the first transistor and a first main electrode of the fifth transistor being connected to each other at a first node, a second main electrode of the fifth transistor and a second main electrode of the second transistor being connected to each other, and a control electrode of the fifth transistor and the second main electrode of the fifth transistor being connected to each other,
a second main electrode of the third transistor and a first main electrode of the fourth transistor being connected to each other at a second node, the second node being connected to the output terminal,
a control electrode of the fourth transistor and the control electrode of the fifth transistor being connected to each other,
the first reference potential terminal being connected to a first main electrode of the second transistor and a second main electrode of the fourth transistor,
the second reference potential terminal being connected to a first main electrode of the sixth transistor and a first main electrode of the third transistor,
the input terminal being connected to a control electrode of the first transistor and a control electrode of the third transistor,
the non-inverted input terminal of the gain control amplifier being connected to the first node, the inverted input terminal of the gain control amplifier being connected to the second node, and the voltage output terminal of the gain control amplifier being connected to a control electrode of the sixth transistor, wherein
the gain control amplifier controls a voltage supplied to the control electrode of the sixth transistor such that the first node and the second node are equal in voltage.

10. The class AB amplifier according to claim 9, wherein the first transistor, the second transistor, the third transistor, the fourth transistor, the fifth transistor and the sixth transistor are each a MOS transistor, and
assuming that the third transistor, the fourth transistor, the fifth transistor and the sixth transistor have gate lengths L3, L4, L5 and L6, respectively, and the third transistor, the fourth transistor, the fifth transistor and the sixth transistor have gate widths W3, W4, W5 and W6, respectively, the following relation holds:

$$(W3/L3)/(W6/L6)=(W4/L4)/(W5/L5)=N$$

where N is an integer.

11. The class AB amplifier according to claim 10, wherein the first main electrode of each of the first transistor, the second transistor, the third transistor, the fourth transistor, the fifth transistor and the sixth transistor is a source, and
the second main electrode of each of the first transistor, the second transistor, the third transistor, the fourth transistor, the fifth transistor and the sixth transistor is a drain.

12. The class AB amplifier according to claim 11, wherein the first conductivity type transistor is an N type MOS transistor, and the second conductivity type transistor is a P type MOS transistor.

13. The class AB amplifier according to claim 11, wherein the first conductivity type transistor is a P type MOS transistor, and the second conductivity type transistor is an N type MOS transistor.

14. An operational amplifier comprising:

a differential input stage to invert and amplify a difference between a first potential and a second potential, and output a control voltage; and an output stage to amplify the control voltage, the output stage being configured as the class AB amplifier according to claim 9.

15. An operational amplifier comprising:

a differential input stage having a non-inverted input terminal and an inverted input terminal, to invert and amplify a difference between a potential at the non-inverted input terminal and a potential at the inverted input terminal, and output a non-inverted intermediate voltage and an inverted intermediate voltage;

a first output stage to amplify the non-inverted intermediate voltage and output an inverted output voltage;

a second output stage to amplify the inverted intermediate voltage and output a non-inverted output voltage; and a common mode feedback amplifier to receive the non-inverted output voltage and the inverted output voltage, and control the differential input stage such that an intermediate voltage between the non-inverted output voltage and the inverted output voltage matches a reference voltage, and the first output stage and the second output stage each being configured as the class AB amplifier according to claim 9.

16. The operational amplifier according to claim 15, wherein the differential input stage is a double differential amplifier having two differential pairs, each of which receives a differential input voltage.

* * * * *